United States Patent

Kubinski et al.

[11] Patent Number: 5,945,904
[45] Date of Patent: *Aug. 31, 1999

[54] GIANT MAGNETORESISTORS WITH HIGH SENSITIVITY AND REDUCED HYSTERESIS AND THIN LAYERS

[75] Inventors: David John Kubinski, Canton Township; Henry Holloway, Dearborn, both of Mich.

[73] Assignee: Ford Motor Company, Dearborn, Mich.

[*] Notice: This patent issued on a continued prosecution application filed under 37 CFR 1.53(d), and is subject to the twenty year patent term provisions of 35 U.S.C. 154(a)(2).

[21] Appl. No.: 08/707,836

[22] Filed: Sep. 6, 1996

[51] Int. Cl.⁶ .................................................... H01L 43/00
[52] U.S. Cl. .................. 338/32 R; 324/207.21; 360/113
[58] Field of Search .................... 338/32 R; 324/252, 324/207.21; 360/113, 126

[56] References Cited

U.S. PATENT DOCUMENTS

| | | |
|---|---|---|
| 5,134,533 | 7/1992 | Freidrich et al. . |
| 5,168,760 | 12/1992 | Wun-Fogle et al. . |
| 5,206,590 | 4/1993 | Dieny et al. . |
| 5,287,238 | 2/1994 | Baumgart et al. . |
| 5,304,975 | 4/1994 | Saito et al. . |
| 5,313,186 | 5/1994 | Schuhl et al. . |
| 5,315,282 | 5/1994 | Shinjo et al. . |
| 5,341,118 | 8/1994 | Parkin et al. . |
| 5,365,212 | 11/1994 | Saito et al. ............................. 338/32 R |
| 5,366,815 | 11/1994 | Araki et al. . |
| 5,408,377 | 4/1995 | Gurney et al. . |
| 5,422,571 | 6/1995 | Gurney et al. . |
| 5,432,661 | 7/1995 | Shinjo et al. . |
| 5,432,734 | 7/1995 | Kawano et al. . |
| 5,447,781 | 9/1995 | Kano et al. ............................. 360/113 |
| 5,462,795 | 10/1995 | Shinjo et al. ............................. 428/332 |
| 5,500,633 | 3/1996 | Saito et al. ............................. 338/32 R |
| 5,510,172 | 4/1996 | Araki et al. ............................. 360/113 |
| 5,514,452 | 5/1996 | Araki et al. ............................. 360/113 |
| 5,648,885 | 7/1997 | Nishioka et al. ............................. 338/32 R |

FOREIGN PATENT DOCUMENTS

| | | |
|---|---|---|
| 0485129 | of 1992 | European Pat. Off. . |
| 483373 | 5/1992 | European Pat. Off. ............. 338/32 R |

OTHER PUBLICATIONS

Giant magnetoresistance in Co/Cu multilayers with very thin Co layers: Reduced hysteresis at the second antiferromagnetic maximum, by D.J. Kubinski and H. Holloway, J. Appl. Phys. 79(3), Feb. 1, 1996, pp. 1661 through 1663.

Parkin, et al., Appl. Phys. Lett. 58(23), Jun. 1991, pp. 2710–2712, "Giant Magnetoresistance in Antiferromagnetic Co/Cu Multilayers".

Stearns et al., Journal of Applied Physics, vol. 67, No. 9, May 1990 pp. 5925–5930, Antiferromagnetic Coupling Between Layers in Co/Cr Multilayer (invited).

Dieny et al., "Giant Magnetoresistance In Soft Ferromagnetic Multilayers", Physical Review B, vol. 43, No. 1, Jan. 1, 1991, pp. 1297–1300.

Le Dang et al., "NMR and Magnetization Studies of Co/Cu Superlattices" Physical Review B, vol. 43, No. 16, Jun. 1, 1991, pp. 43–46.

(List continued on next page.)

*Primary Examiner*—Lincoln Donovan
*Assistant Examiner*—Karl Easthom
*Attorney, Agent, or Firm*—Mark S. Sparschu

[57] ABSTRACT

A giant magnetoresistive assembly includes a first film fabricated of a ferromagnetic material having a first predetermined thickness, a second film fabricated of a non-ferromagnetic material formed to said first film having a second predetermined thickness greater than said first predetermined thickness, and a third film fabricated of a ferromagnetic material formed to the second film having a third predetermined thickness wherein the third predetermined thickness differs from the first predetermined thickness.

7 Claims, 4 Drawing Sheets

OTHER PUBLICATIONS

Speriousu et al., "Nonscillatory Magnetoresistance in Co/CU/Co Layered Structures With Oscillatory Coupling", Physical Review B, vol. 44, 10, Sep. 1, 1991, pp. 5350–5361.

de Gronckel et al., "Nanostructure of Co/Cu Multilayers", Physical Review B, vol. 44, No. 16, Oct. 15, 1991, pp. 9100–9103.

J.C. Slonczewski, Journal of Magnetism and Magnetic Materials, vol. 129, Nov. 1994, pp. 1–7, Magnetostatic Mechanism For Field–Sensitivity of Magnetoresistance in Discontinuous Magnetic Multilayers.

GIANT MAGNETORESISTORS WITH HIGH SENSITIVITY AND REDUCED HYSTERESIS AND THIN LAYERS

BACKGROUND OF THE INVENTION

1. Field of the Invention

The invention relates generally to sensing assemblies. More particularly, the invention relates to sensing assemblies including giant magnetoresistors with reduced hysteresis and high sensitivity.

2. Description of the Related Art

Various types of non-contact measuring device are presently available for measuring linear and angular displacement and detecting absolute position of an object in linear or angular system along with speed. A classic example is a sliding resistor potentiometer which, as known to those skilled in the art, is generally unreliable. Optical position devices are also available which utilize optical sensors to provide an optical scale such as a slit scale. While generally more reliable than the aforementioned resistor potentiometer instruments, optical position devices nonetheless require complicated construction and are, thus, expensive to manufacture and somewhat difficult to use. They are also very sensitive to dirt and other contaminates and have been found in practice very difficult to keep clean.

There are also available magnetic scales wherein a scale written into a magnetic medium is read out by a magnetic sensor. Again, however, these devices require a fairly complicated structure and are, thus, expensive to manufacture and difficult to use.

It is well established that giant magnetoresistive properties occur with structures in which thin films of a ferromagnetic metal are separated by thin films of a non-ferromagnetic metal. A well-known example uses thin films of cobalt separated by thin films of copper. The thickness of the non-ferromagnetic separator should be chosen to promote antiferromagnetic coupling. For example, this is achieved with cobalt films and copper separator thicknesses of approximately 9 Angstrom and approximately 20 Angstrom, respectively. Typical ferromagnetic thicknesses are of the order of 10 Angstrom. For convenience, we shall refer to such films as "conventional" ferromagnetic films. Typically, these devices contain 20–30 ferromagnetic films with a corresponding number of non-ferromagnetic separators, but the minimum workable device would contain two ferromagnetic films and one non-ferromagnetic separator. All such devices require a suitable substrate, on which the stack of ferromagnetic and non-ferromagnetic films is deposited, and they may also contain cap films on top of and buffer films under the stack.

One attempt to overcome the aforementioned difficulties associated with the prior art devices is disclosed in U.S. Pat. No. 5,313,186, issued to Schuhl et al. on May 17, 1994. The Schuhl et al. reference discloses a sensor used to sense weak magnetic fields. The sensor incorporates a giant magnetoresistive device. More specifically, the giant magnetoresistive device disclosed in the Schuhl et al. reference includes a metallic multilayered structure formed by alternating magnetic and non-magnetic metals. The magnetic films all have the same thickness. The non-magnetic metals are disclosed having equal thickness and, in other embodiments, varying thicknesses. The thicknesses of the ferromagnetic films vary between five Angstrom to 100 Angstrom such that, when there is no magnetic field, the films of the magnetic material have an anti-ferromagnetic type of coupling. The differences in thicknesses of the non-magnetic materials results in coupling or the frustration thereof with respect to the magnetic films.

Although the structure disclosed in the Schuhl et al. reference is highly sensitive to weak magnetic fields, the structure is an impractical sensor in environments wherein absolute position is required. More specifically, the use of a giant magnetoresistive sensor produces hysteresis. The resistance maximum does not occur exactly at zero applied field. Instead, the resistance lags behind the applied field as the magnetic field is cycled between extreme positive and negative values. This causes an undesirable uncertainty in the magnetic field that is associated with a particular value of the resistance. The occurrence of hysteresis makes the giant magnetoresistor sensor disclosed in the Schuhl et al. reference undesirable for applications where the sequence of previous positions is arbitrary, rather than well defined.

SUMMARY OF THE INVENTION

A giant magnetoresistive assembly is disclosed including a stack of films of a ferromagnetic material with consecutive pairs of these films separated by films of a non-ferromagnetic material whose average thickness is chosen to promote antiferromagnetic coupling between consecutive pairs of ferromagnetic films. The essential feature that distinguishes the invention from the prior art (described above) is that all or a significant fraction of the ferromagnetic films have average thicknesses in the range one to four Angstrom. For convenience, we shall refer to these as "very thin" ferromagnetic films. There are two preferred embodiments. In the first, all of the ferromagnetic films are "very thin." In the second, consecutive ferromagnetic films alternate between "very thin" and "conventional." In each of these cases, the minimum implementation of the stack is a pair of ferromagnetic films that are separated by a single non-ferromagnetic film.

One advantage associated with the invention is the ability to sense a magnetic field accurately with a high degree of sensitivity with the elimination of the inaccuracies due to hysteresis. Another advantage associated with the invention is the ability to eliminate the hysteresis without additional hardware or software controls. Still another advantage associated with the invention is the ability to reduce the hysteresis of the giant magnetoresistive sensor with only a minor sacrifice of sensitivity.

Other features and advantages of the present invention will be readily appreciated as the same becomes better understood after reading the subsequent description taken in conjunction with the accompanying drawings.

DESCRIPTION OF THE PREFERRED EMBODIMENT(S)

Figure 1:
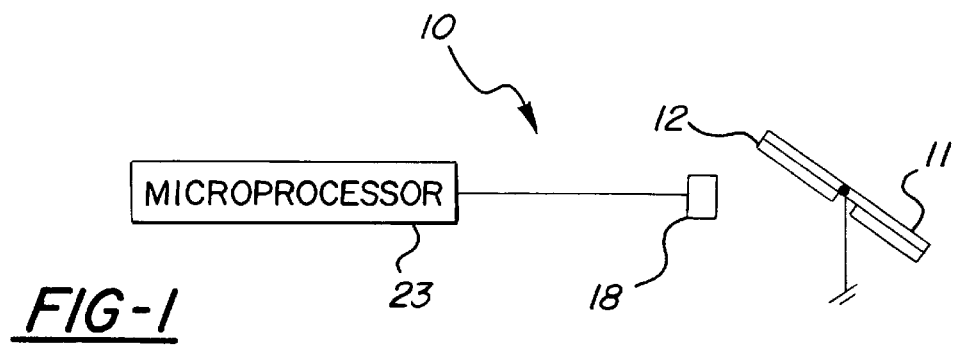
FIG. 1 is a perspective view of one embodiment of a sensor incorporated the invention.

Referring to FIG. 1, one embodiment of a position sensing apparatus of the invention is shown at 10. The position sensing apparatus 10 is a sensing assembly used to sense a butterfly valve 11 of a throttle assembly (not shown). The sensing assembly 10 includes a magnet 12. The magnet 12 is operative to generate a magnetic field inside and outside of its surfaces. As those skilled in the art will recognized, the field direction of the generated magnetic field alternates between being perpendicular to the magnetic surface immediately above a pole and parallel to the magnetic surface midway between adjacent poles.

The magnetic circuit further includes a giant magnetoresistive sensor 18. The giant magnetoresistive sensor 18, as discussed below in greater detail, includes alternating films of non-ferromagnetic metal 20 and ferromagnetic metal 22. In one preferred embodiment, these alternating films may include copper and cobalt, respectively. These specific compositions are not, however, necessarily required. Indeed, the alternating films of non-ferromagnetic metal are selected from a group consisting of copper, silver and chromium. Similarly, the alternating films of ferromagnetic metal are selected from a group consisting of cobalt, iron and nickel, and alloys with each other or other metals. The giant magnetoresistive sensor 18 is affixed adjacent the object whose position is sought to be determined. The output of the giant magnetoresistive sensor 18 is received by a microprocessor 23 for retrieval, conditioning and other such functions known to those skilled in the art.

VERY THIN FERROMAGNETIC FILMS

An article, namely the giant magnetoresistive sensor 18, is shown to include a stack of films. The stack of films includes a plurality of ferromagnetic films. Each of these ferromagnetic films is separated by a non-ferromagnetic layer. The minimum number of films in a stack is three; two ferromagnetic films separated by a non-ferromagnetic film. Typically, a stack may consist of twenty to thirty films wherein each of the ferromagnetic films is separated by a non-ferromagnetic film.

Figure 2:
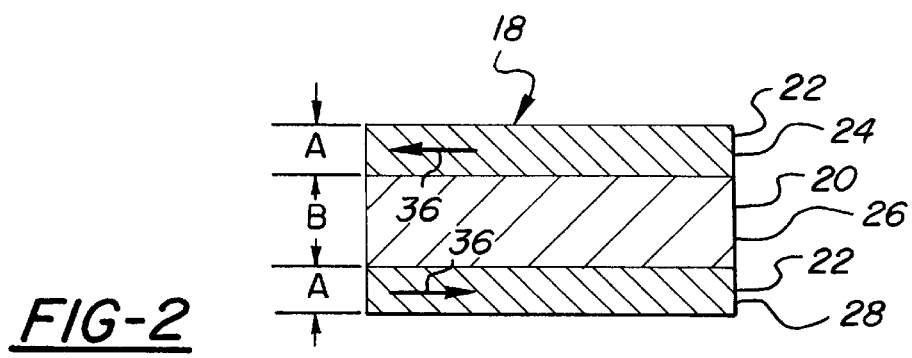
FIG. 2 is a side view of one embodiment of the invention.

Referring to FIG. 2, the magnetoresistor 18 includes a discrete first film 24 of ferromagnetic material 22. A discrete second film 26 of non-ferromagnetic material 20 is formed to and contacts directly the first film 24. More specifically, the second film 26 is formed by depositing the non-ferromagnetic material 20 onto the first film 24. The deposition of the materials to create any of the films may be done by any conventional manner capable of controlling the thickness of the films on the order of Angstroms. A discrete third film 28 of ferromagnetic material is formed to and contacts directly the second film 26 of the giant magnetoresistive sensor 18. The third film 28 has a predetermined average thickness A in the range from one Angstrom through four Angstrom. (All thickness are average values, about which point-to-point variations may exist). In one embodiment, the average thickness A is approximately three Angstrom. In the embodiment shown in FIG. 2, the first film 24 of ferromagnetic material 22 also has an average thickness A which is in the range from one Angstrom through four Angstrom and, preferably, three Angstrom in thickness. Likewise, the second film 26 of non-ferromagnetic material 20 includes a thickness B in the range from eighteen Angstrom through twenty two Angstrom. In a preferred embodiment, the thickness B of the second film 26 is approximately twenty Angstrom. The second film 26 acts a spacer separating the third film 28 from the first film 24.

Although the embodiment shown in FIG. 2 is shown in as a three film structure, it should be appreciated that this is the minimum number of elements that can form a stack as described above. In practice, a stack of ten to thirty ferromagnetic films separated by a number of non-ferromagnetic films is preferred.

COMBINATION OF VERY THIN AND CONVENTIONAL THICKNESS FERROMAGNETIC FILMS

Figure 3:
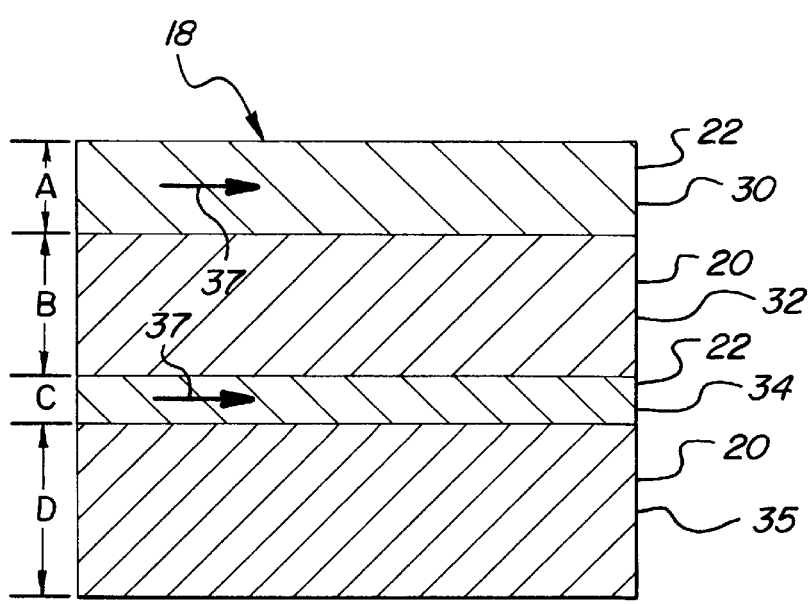
FIG. 3 is a side view of another embodiment of the invention.
Figure 7:
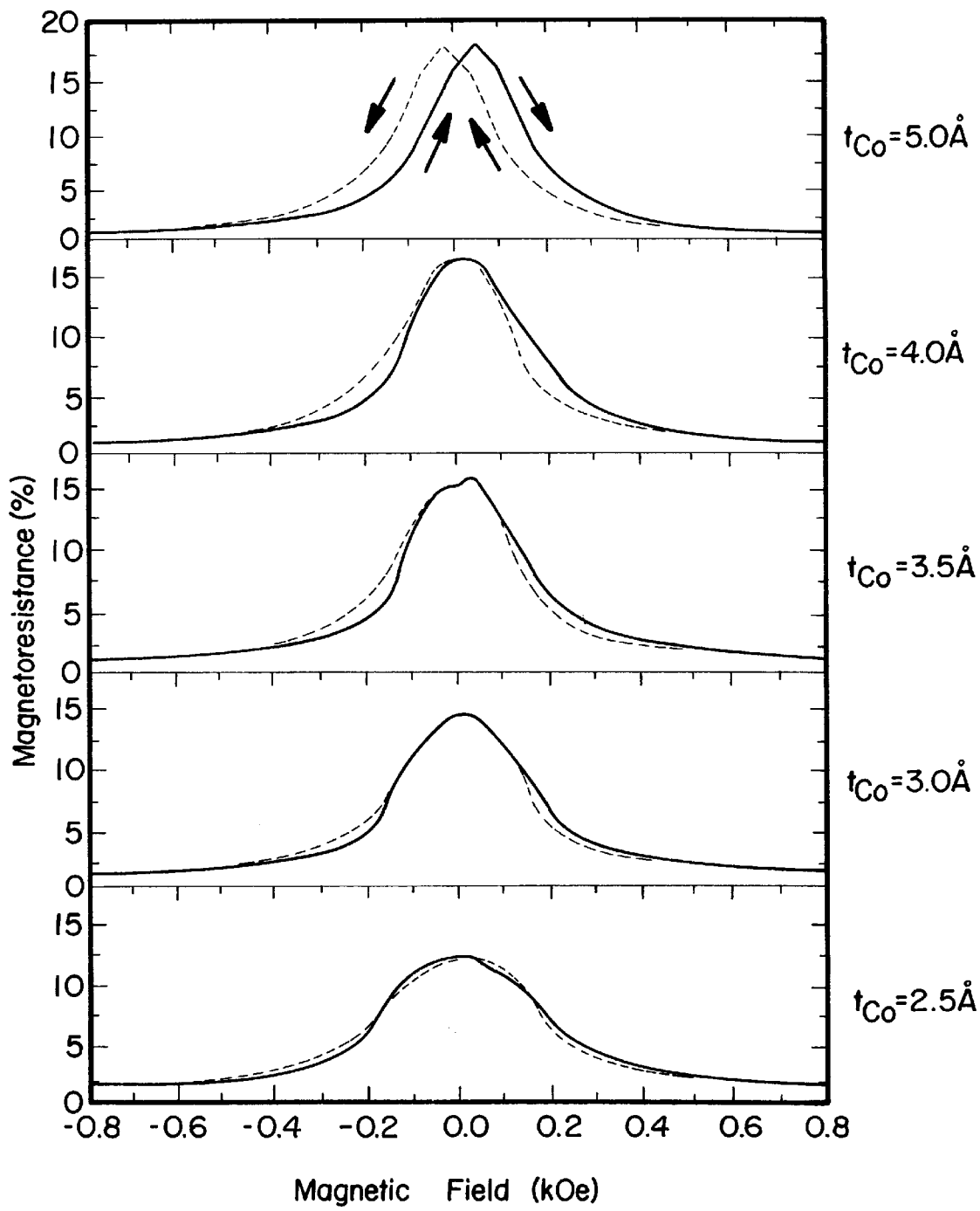
FIG. 7 is a graphic representation of the resistance/magnetic field curve showing varying degrees of hysteresis based differing thicknesses of the ferromagnetic films.

Referring now to FIG. 3, an alternative embodiment of the giant magnetoresistive sensor 18 is shown wherein a fraction of the ferromagnetic films is very thin and a second fraction of ferromagnetic films is conventional. Like the first embodiment shown in FIG. 2, a first film 30 is fabricated from a ferromagnetic material 22 having a first predetermined thickness A. A second film 32 is fabricated from the non-ferromagnetic material 20. The second film 32 is formed to the first film 30. The second film 32 has a second predetermined thickness B. The second predetermined thickness B is greater than the first predetermined thickness A of the first film 30. The giant magnetoresistive sensor 18 includes a third film 34 which is fabricated from ferromagnetic material 22. The third film 34 is formed to the second film 32. The third film 34 has a third predetermined thickness C. The third predetermined thickness C is not equal to the first predetermined thickness A. In the embodiment shown in FIG. 3, the first predetermined thickness A is in the range from ten Angstrom to one hundred Angstrom. More specifically, the first predetermined thickness A is in the conventional range known to those skilled in the art. The third predetermined thickness C is very thin. More specifically the third predetermined range is in the range from one Angstrom through four Angstrom. The second thickness B of the second film 32 is in the range from seventeen Angstrom through twenty three Angstrom. In an alternative embodiment not shown, the second thickness of the second film 32 could be within the range from seven Angstrom through eleven Angstrom. A fourth film 35 is shown in FIG. 3 formed to the third film 34. The fourth film 35 is shown for an example discussed subsequently and the output of which is shown in FIG. 7. The fourth film 35 has a fourth predetermined thickness D equal to the second predetermined thickness B.

Figure 4:
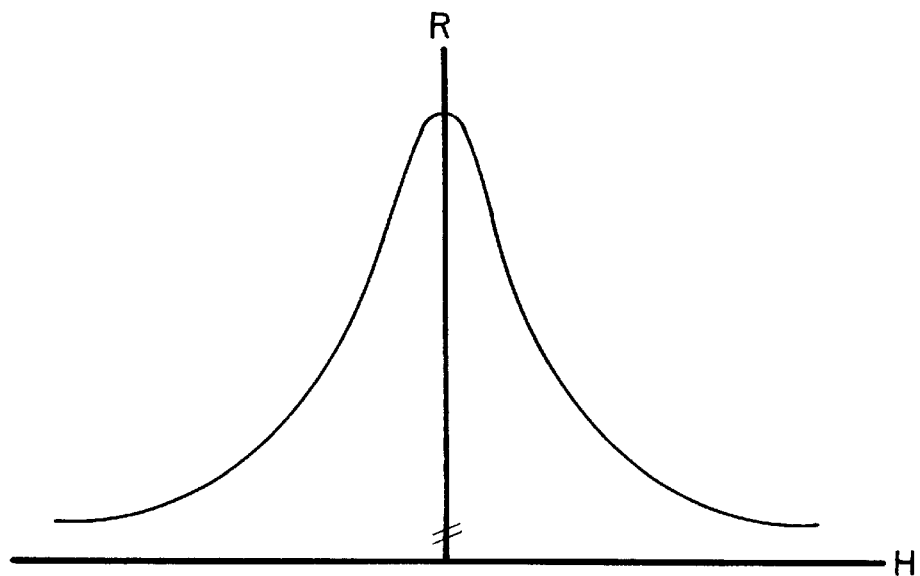
FIG. 4 is a graphic representation of giant magnetoresistance.

Referring to FIG. 4, an ideal representation of a phenomenon of magnetoresistivity is generally shown. FIG. 4 is a graph of resistance as a function of magnetic field. With the appropriate choice of a non-ferromagnetic space or thickness and, in the absence of an applied magnetic field, the magnetization of adjacent ferromagnetic films are aligned antiferromagnetically. Arrows 36 in FIG. 2 represent this state, a relatively high-resistivity state. With the application of a magnetic field, the magnetization of the ferromagnetic films 22 are made parallel, as represented by arrows 37 in FIG. 3 and the resistivity decreases. The change in resistivity is largest at a first antiferromagnetic maximum (AFM), a magnetic field on the order of one or two kOe. The first AFM occurs when the thickness of the non-ferromagnetic films are in the range of seven Angstrom through eleven Angstrom. At a second AFM, when the non-ferromagnetic film has a thickness in the range of seventeen Angstrom through twenty three Angstrom, the field required to overcome the antiferromagnetic alignment is substantially smaller so that this condition gives the maximum sensitivity to changes in the magnetic field.

Figure 5:
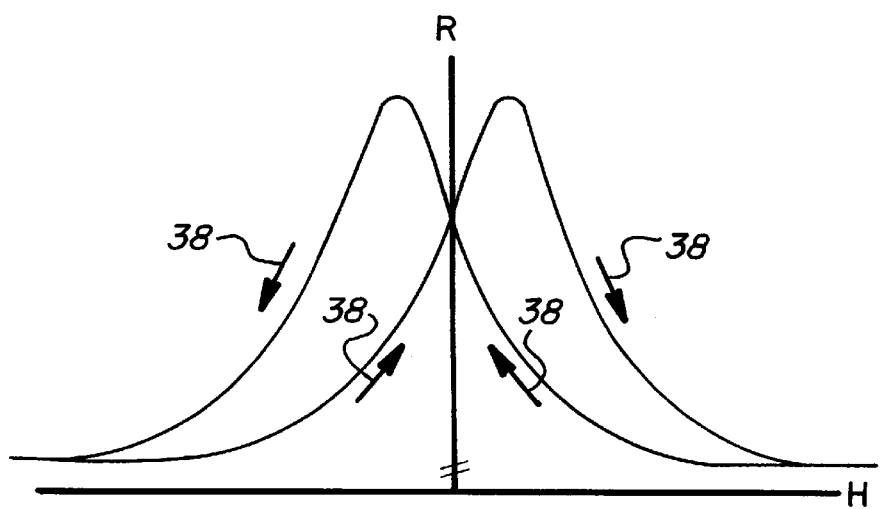
FIG. 5 is a graphic representation of a resistance/magnetic field curve depicting the phenomena of hysteresis.

Referring to FIG. 5, a realistic representation of giant magnetoresistivity is shown. As in FIG. 4, FIG. 5 is a graph of resistivity as a function of magnetic field. It is shown here that, unlike the ideal shown in FIG. 4, the resistance maximum does not actually occur at zero applied field. Instead, the resistance lags behind the applied field as one follows the curves and the directions of arrows 38. The arrows 38 represent the path in which resistivity rises and falls as the magnetic field is cycled between extreme positive and negative values. As is apparent to those skilled in the art, this causes an undesirable uncertainty in the magnetic field that is associated with a particular value of resistance. As a fraction of the magnetic field required for saturation, the splitting of the resistivity as a function of magnetic field curve is larger at the second AFM than at the first.

Figure 6:
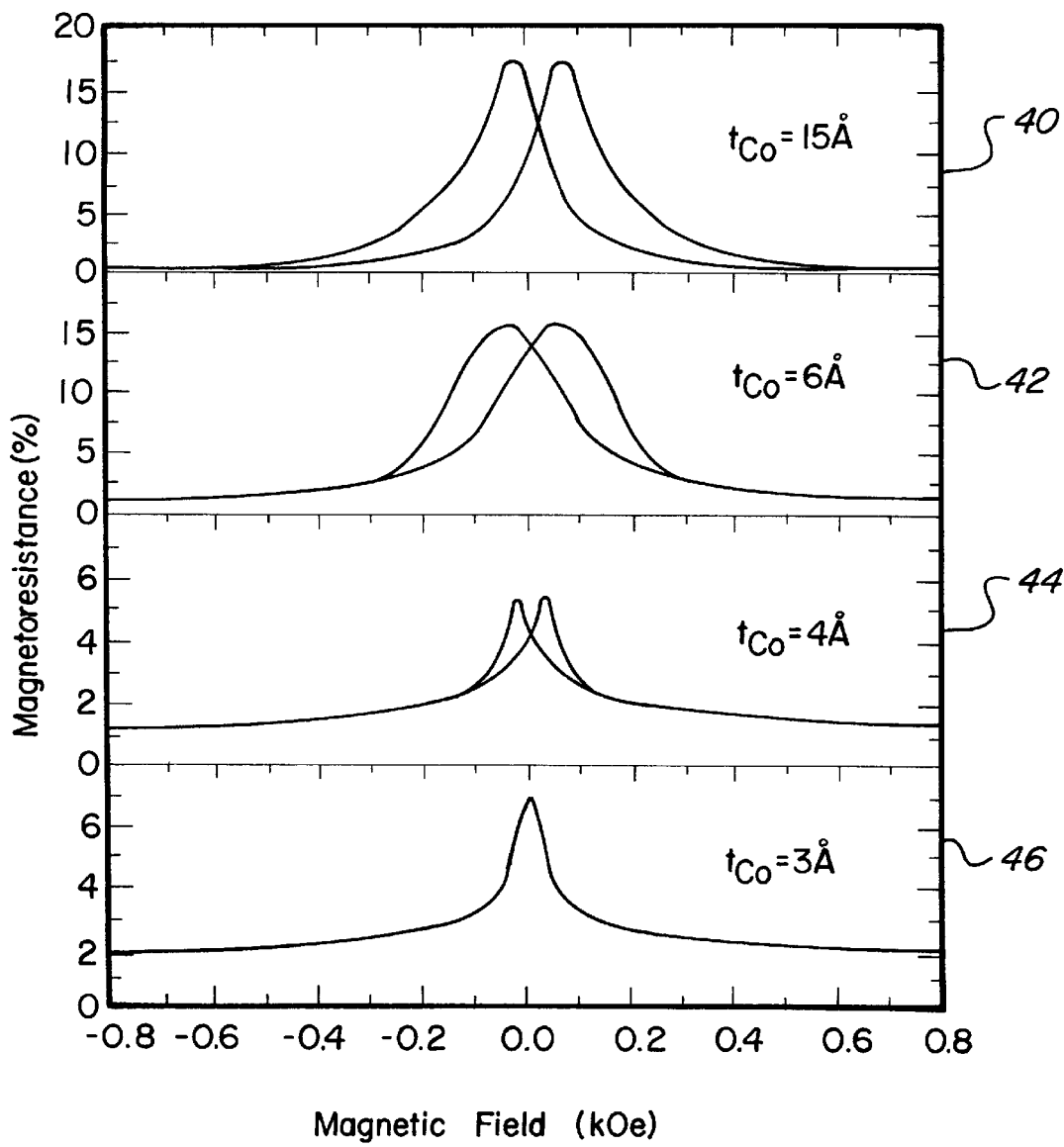
FIG. 6 is a graphic representation of the resistance/magnetic field curve showing varying degrees of hysteresis based on the thickness of the ferromagnetic films.

Referring to FIG. 6, the magnetoresistance of a sensor having only very thin ferromagnetic films similar to that shown in FIG. 2 is shown as a function of magnetic field for giant magnetoresistive sensors 18. The top quarter 40 of FIG. 6 represents a typical giant magnetoresistive sensor having the ferromagnetic material 22 in the first 24 and third 28 films have a conventional thickness approximating fifteen Angstrom as is known to those skilled in the art. As may be seen in quarter 40 of FIG. 6, the hysteresis phenomena is quite prevalent. In the second quarter 42 of FIG. 6, the thickness of the ferromagnetic material 22 in the first 24 and third 28 films approximates six Angstrom. It may be seen that the phenomena of hysteresis is reduced. In the third quarter 44 of FIG. 6, where the thickness A of the ferromagnetic material 22 in the first 24 and third 28 films approximates four Angstrom, the phenomena of hysteresis is even further reduced. Finally, as shown in the fourth quarter 46 of FIG. 6, the ideal thickness of three Angstrom for the ferromagnetic material 22 of both the first 24 and third 28 films creates and ideal resistivity output of the giant magnetoresistive sensor 18 by the near elimination of hysteresis.

Referring to FIG. 7, a similar graph to that of FIG. 6 is shown. In FIG. 7, however, the thickness of the first film is conventional whereas the third film 34 is very thin. In this example, the fourth film 35 of material is added to the three shown as a unit in FIG. 3. The fourth film is a non-ferromagnetic material similar to the second film 32. Further, the third film 34 is shown to vary in the five steps from five Angstrom to two and one half Angstrom with half Angstrom steps. The hysteresis is reduced drastically as the thickness of the third film 34 is reduced to two and one half Angstrom. The first film 30 has a thickness A approximating fifteen Angstrom. The second film 32 has a thickness B approximating twenty Angstrom. The thickness C of the third film 34 varies as is shown in FIG. 7. The fourth film 35 has fourth thickness D approximating twenty Angstrom. This unit of four films was repeated ten times on a seventy-five Angstrom buffer.

Referring again to FIG. 6, the average thickness of the ferromagnetic films 24,28 were reduced while the thickness of the non-ferromagnetic film 26, typically referred to as a spacer, is held at a constant twenty Angstrom, i.e., at the second AFM. These measurements were made at room temperature. It may appreciated by those viewing FIG. 6 that the phenomenon of hysteresis is greatly reduced when the average thickness of the ferromagnetic material is less than six Angstrom. The phenomenon of hysteresis is substantially eliminated when the thickness of the ferromagnetic material is approximately three Angstrom. With a three Angstrom thick film for the ferromagnetic material, the magnetoresistance is smaller than with the ferromagnetic films having a thickness of fifteen Angstrom, a conventional thickness typically known in the art. However, the peak resistance in the resistance/magnetic field curve is much narrower using the three Angstrom thick ferromagnetic films. Consequently, the sensitivity to changes in the magnetic field may remain large. The maximum slope of the resistance/magnetic field curve give a sensitivity which is defined as the first derivative of the resistivity curve as a function of the magnetic field multiplied by the inverse resistance. In the examples shown for a three Angstrom thick ferromagnetic film, the sensitivity is approximately $0.7 \times 10^{-3}$ $Oe^{-1}$. With a fifteen Angstrom thick ferromagnetic film, the sensitivity is approximately $1.2 \times 10^{-3}$ $Oe^{-1}$. Although the sensitivity for the three Angstrom thick ferromagnetic films is approximately half that of the fifteen Angstrom thick ferromagnetic films, the sensitivity is still high.

The invention has been described in an illustrative manner. It is to be understood that the terminology which has been used is intended to be in the nature of words of description rather than of limitation.

Many modifications and variations of the invention are possible in light of the above teachings. Therefore, within the scope of the appended claims, the invention may be practiced other than as specifically described.

We claim:

1. A magnetoresistor with reduced magnetoresistive hysteresis consisting of a stack of a plurality of discrete ferromagnetic films and a discrete non-ferromagnetic film separating and contacting directly each of one of said ferromagnetic films in an alternating manner wherein each of said ferromagnetic films has an average thickness in a range from one Angstrom to four Angstrom and each of said non-ferromagnetic films has an average thickness in a range from seventeen Angstrom through twenty three Angstrom wherein one of said ferromagnetic films on one side of one of said non-ferromagnetic films has a thickness different than a thickness of another of said ferromagnetic films on the other side of the one of said non-ferromagnetic films.

2. A magnetoresistor as set forth in claim 1 wherein each of said ferromagnetic films has an average thickness of approximately three Angstrom.

3. A magnetoresistor as set forth in claim 1 said plurality of ferromagnetic films are fabricated from a group of materials consisting of iron, cobalt and nickel.

4. A magnetoresistor as set forth in claim 1 wherein said non-ferromagnetic film is fabricated from a group of materials consisting of copper and copper compounds.

5. A magnetoresistor as set forth in claim 1 wherein said non-ferromagnetic film is fabricated from a group of materials consisting of silver, gold, and chromium.

6. A magnetoresistor as set forth in claim 1 wherein said plurality of ferromagnetic films are fabricated from a group of materials consisting of iron, cobalt and nickel and said non-ferromagnetic film is fabricated from a group of materials consisting of copper and copper compounds.

7. An article for reducing magnetoresistive hysteresis consisting of:

a discrete first layer fabricated of ferromagnetic material, said first layer having a thickness in a range from ten Angstrom to one hundred Angstrom;

a discrete second layer fabricated of non-ferromagnetic material contacting directly said first layer, said second layer having a thickness in a range from seven Angstrom through eleven Angstrom; and a discrete third layer fabricated of ferromagnetic material contacting directly said second layer, said third layer having a thickness in a range from one Angstrom to four Angstrom, said second layer being repeated in an alternating manner between said third layer and said first layer.

* * * * *